United States Patent
Roohparvar

(10) Patent No.: US 6,457,093 B2
(45) Date of Patent: *Sep. 24, 2002

(54) CIRCUIT AND METHOD TO CONTROL OPERATIONS OF ANOTHER CIRCUIT

(75) Inventor: Frankie Fariborz Roohparvar, Milpitas, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/901,834

(22) Filed: Jul. 10, 2001

Related U.S. Application Data

(63) Continuation of application No. 09/107,062, filed on Jun. 30, 1998, now Pat. No. 6,260,104.

(51) Int. Cl.$^7$ .............................................. G06F 12/00
(52) U.S. Cl. ..................... 711/103; 711/154; 711/211; 365/185.29; 365/185.33; 365/191
(58) Field of Search ................................. 711/154, 103, 711/211; 365/185.29, 185.33, 189.01, 189.02, 189.09, 191; 370/533, 536

(56) References Cited

U.S. PATENT DOCUMENTS

| | | |
|---|---|---|
| 4,874,992 A | 10/1989 | Benson et al. |
| 5,553,021 A | 9/1996 | Kubono et al. |
| 5,592,488 A | 1/1997 | Thomann et al. |
| 5,615,159 A | 3/1997 | Roohparvar |
| 5,619,453 A | 4/1997 | Roohparvar et al. |
| 5,619,461 A | 4/1997 | Roohparvar |
| 5,627,784 A | 5/1997 | Roohparvar |
| 5,682,345 A | 10/1997 | Roohparvar et al. |
| 5,933,374 A | 8/1999 | Weinfurtner |
| 6,011,418 A | 1/2000 | Siniscalchi |
| 6,073,204 A * | 6/2000 | Lakhani et al. ............. 711/100 |
| 6,147,908 A * | 11/2000 | Abugharbieh et al. ... 365/185.2 |
| 6,260,104 B1 * | 7/2001 | Roohparvar ................ 711/103 |

* cited by examiner

*Primary Examiner*—Matthew Kim
*Assistant Examiner*—Matthew D. Anderson
(74) *Attorney, Agent, or Firm*—Schwegman, Lundberg, Woessner & Kluth, P.A.

(57) ABSTRACT

An integrated circuit includes trim circuitry to control operations of internal circuitry. The integrated circuit includes multiplex circuitry for coupling the trim circuitry to internal circuits via a trim bus in a manner which reduces die area. The trim circuitry is controlled such that fuses used to control different level and timing parameters are grouped together and routed across the integrated circuit using the trim bus and multiplex circuit.

32 Claims, 7 Drawing Sheets

US 6,457,093 B2

CIRCUIT AND METHOD TO CONTROL OPERATIONS OF ANOTHER CIRCUIT

This application is a continuation of U.S. patent application Ser. No. 09/107,062, filed Jun. 30, 1998 now U.S. Pat. No. 6,260,104.

TECHNICAL FIELD OF THE INVENTION

The present invention relates generally to static information storage and in particular the present invention relates to multiplexing trim circuits.

BACKGROUND OF THE INVENTION

Many processor systems which operate with an associated memory require a particular memory configuration to operate properly. By way of example, some systems require a word length of eight bits and some require sixteen bits. There are conventional memory systems available which permit the end user to control the word size to some degree. However, this somewhat increases the complexity imposed upon the end user of the memory since the end user must provide the necessary signals to the memory for controlling the word length. As a further example, most processor systems look to a certain portion of a memory for boot data at power on. Such boot data is necessary for the processor to function in a system. The processor will be implemented to expect the boot data to be at a specific memory address. Some processors expect the boot data to be at the memory low addresses (bottom boot) and some processors expect the boot data to be at the memory high addresses (top boot). In order to provide capabilities for different types of processor systems, it is possible to produce a different memory system for each application. However, it is always desirable to limit the number of different memory types which must be manufactured.

It is desirable to have a memory system which can be fully characterized after fabrication. See for example U.S. Pat. No. 5,627,784 entitled "Memory System Having Non-Volatile Data Storage Structure for Memory Control Parameters and Method" which is incorporated herein for a description of a memory which uses non-volatile data storage units for controlling parameters of the memory device. These non-volatile data storage units are typically located in a common area on the integrated circuit and are coupled to circuitry which is located throughout the integrated circuit. The interconnect system is both complex and requires substantial die area.

For the reasons stated above, and for other reasons stated below which will become apparent to those skilled in the art upon reading and understanding the present specification, there is a need in the art for a memory which uses data storage units for controlling parameters of the memory device and reduces die area by multiplexing control signals.

SUMMARY OF THE INVENTION

The above mentioned problems with routing control signals and other problems are addressed by the present invention and will be understood by reading and studying the following specification.

In particular, the present invention describes an integrated circuit comprising trim circuitry which provides output signals to control operations of internal circuitry. The trim circuitry includes a plurality of non-volatile fuse adapted to provide X trim signals. A trim bus is selectively coupled to the trim circuitry for routing the X trim signals across the integrated circuit. The trim bus comprises Y interconnect lines, where Y is greater than X. Multiplex circuitry is provided for coupling a group of Y trim signals selected from the X trim signals of the trim circuitry to internal circuits via the trim bus.

Another aspect of the invention provides a flash memory device comprising trim circuitry which provides output signals to control operations of internal circuitry. The trim circuitry includes a plurality of non-volatile memory cells adapted to provide X trim signals. A trim bus is selectively coupled to the trim circuitry for routing the X trim signals across the flash memory device, the trim bus comprising Y interconnect lines, where Y is greater than X. Further, multiplex circuitry is provided for coupling a group of Y trim signals selected from the X trim signals of the trim circuitry to internal circuits via the trim bus.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

The present invention provides a memory which multiplexes trim circuitry that controls parameters of the memory to reduce die area. Prior to describing these features in greater detail, a brief description of a flash memory of the present invention is provided.

Flash Memory

Figure 1:
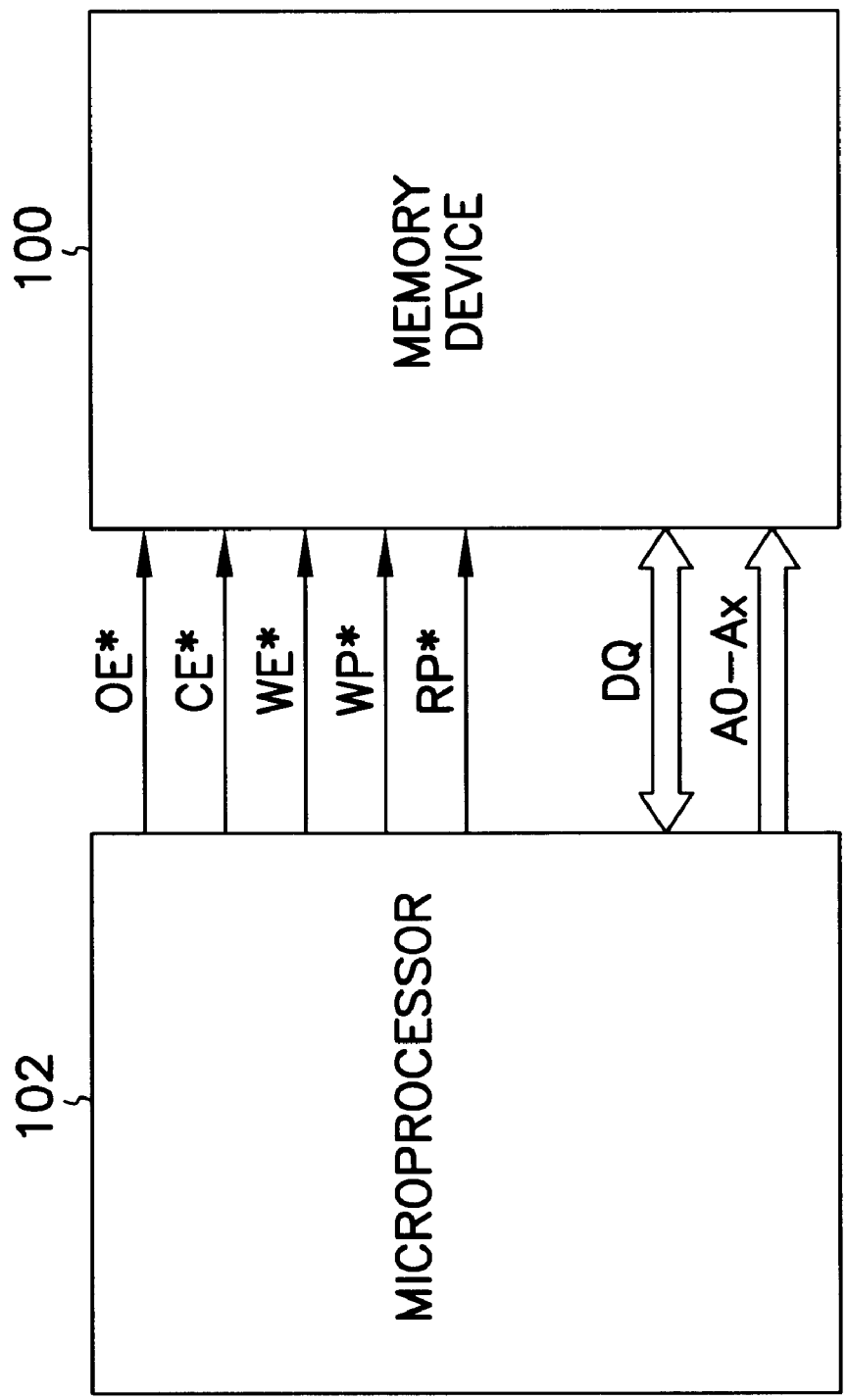
FIG. 1 is a block diagram of a flash memory incorporating the present invention.

FIG. 1 illustrates a block diagram of a Flash memory device 100 which is coupled to a flash controller 102. The memory device has been simplified to focus on features of the memory which are helpful in understanding the present invention. The memory device 100 includes an array of memory cells 104, FIG. 2. The memory cells are preferably floating gate memory cells. The array is arranged in rows and columns, with the rows arranged in blocks. The blocks allow memory cells to be erased in large groups. Data, however, is stored in the memory array in small data groups (byte or group of bytes) and separate from the block structure. Erase operations are performed on a large number of cells in parallel.

An x-decoder 108 and a y-decoder 110 are provided to decode address signals provided on address lines A0-Ax 112. Address signals are received and decoded to access the memory array 104. An address buffer circuit 106 is provided to latch the address signals. A y-select circuit 116 is provided to select a column of the array identified with the y-decoder 110. Sense amplifier and compare circuitry 118 is used to sense data stored in the memory cells and verify the accuracy of stored data. Data input 120 and output 122 buffer circuits are included for bi-directional data communication over a plurality of data (DQ) lines with the microprocessor 102. Command control circuit 114 decodes signals provided on control lines from the microprocessor. These signals are used to control the operations of the memory, including data read, data write, and erase operations. Input/output control circuit 124 is used to control the input and output buffers in response to some of the control signals. The flash memory includes a charge pump circuit 123 which generates a Vpp voltage used during programming of the memory cells and other internal operations. During write operations, Vpp is coupled to the memory cells for providing appropriate write operation programming power. Charge pump designs are known to those skilled in the art, and provides power which is dependant upon an externally provided supply voltage Vcc.

Latch circuitry 125 is provided in the memory for latching locations of memory cells which are not successfully written to during a memory write operation. The latch circuitry allows rewrite operations, as described below, to be performed after a plurality of separate memory write operations are performed.

Figure 2:
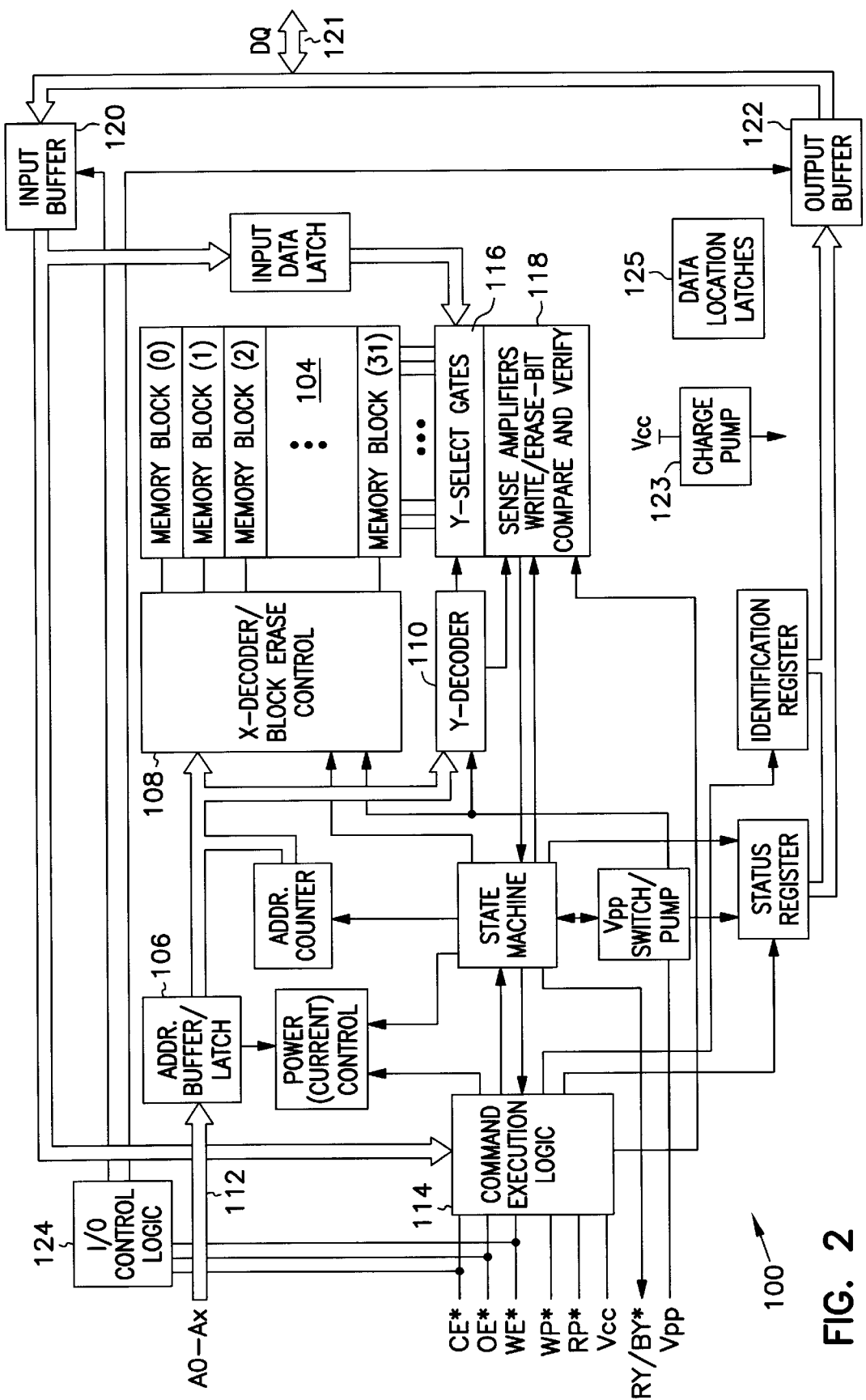
FIG. 2 is a more detailed illustration of the memory of FIG. 1.

As stated above, the Flash memory of FIGS. 1 and 2 has been simplified to facilitate a basic understanding of the features of the memory. A more detailed understanding of Flash memories is known to those skilled in the art. It will be appreciated that more than one Flash memory can be included in various package configurations. For example, Flash memory cards can be manufactured in varying densities using numerous Flash memories.

Trim Circuitry

Figure 3:
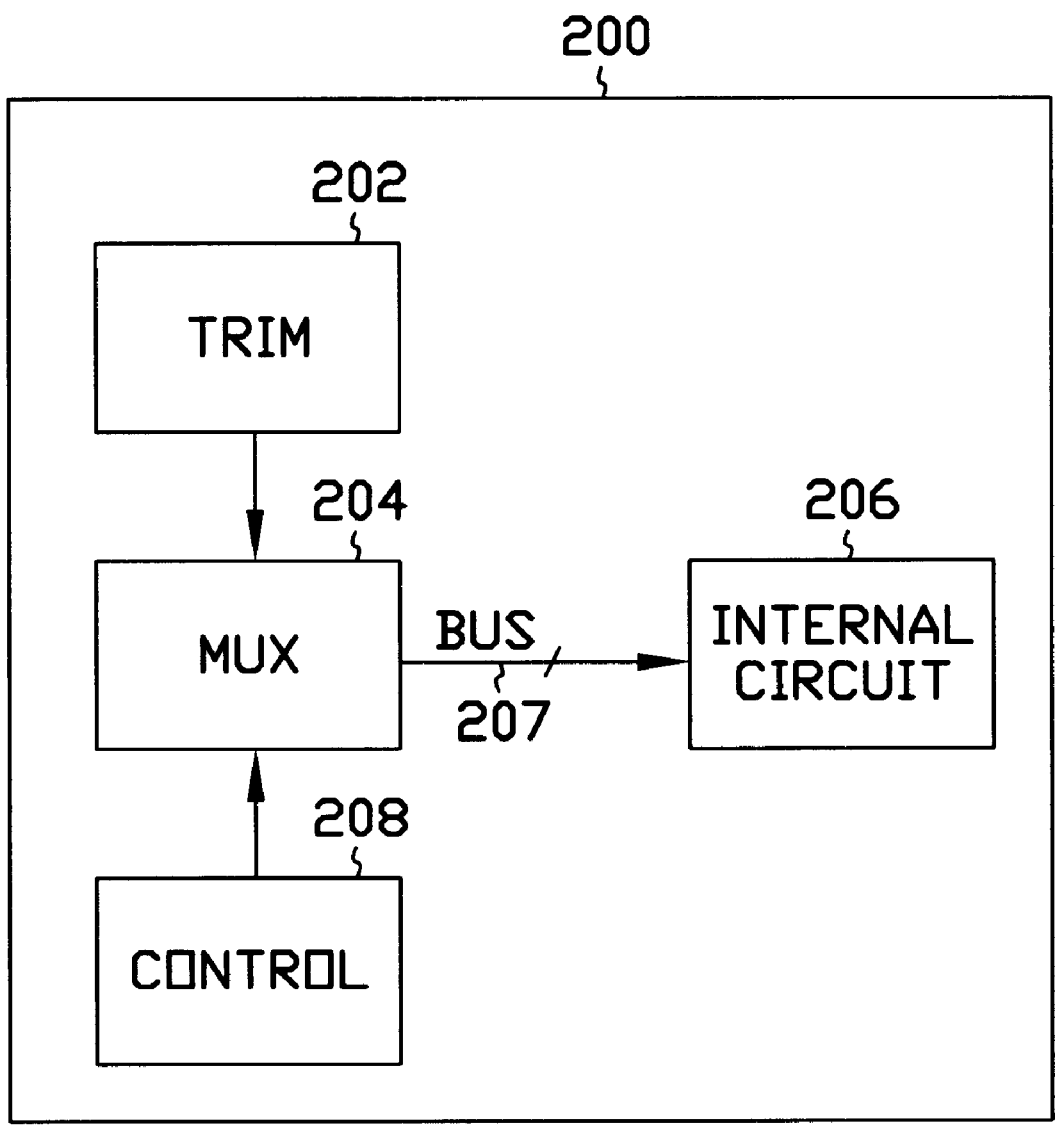
FIG. 3 is a block diagram of an integrated circuit incorporating the present invention.

FIG. 3 illustrates a block diagram of an integrated circuit 200, such as a memory device, incorporating the present invention. The integrated circuit includes trim circuitry 202 which provides output signals to control operations of internal circuitry. Because the trim circuitry includes non-volatile memory it is best suited for use in memory circuits and the trim circuitry is fabricated in close proximity to a memory array. The integrated circuit includes multiplex circuitry 204 for coupling the trim circuitry to internal circuits 206 via a trim bus 207 and control 208 in a manner which reduces die area. That is, trim circuitry is controlled such that fuses used to control different level and timing parameters are grouped together and routed across the integrated circuit using the trim bus and multiplex circuit.

A description of a memory device with control parameters using non-volatile storage is described in U.S. Pat. No. 5,627,784 issued May 6, 1997 and entitled "MEMORY SYSTEM HAVING NON-VOLATILE DATA STORAGE STRUCTURE FOR MEMORY CONTROL PARAMETERS AND METHOD". U.S. Pat. No. 5,682,345 issued Oct. 28, 1997, entitled "NON-VOLATILE DATA STORAGE UNIT AND METHOD OF CONTROLLING SAME" describes a non-volatile unit for storing control parameters. Each of the above references are incorporated herein, and provide a description of the trim fuses and there intended uses.

Figure 4:
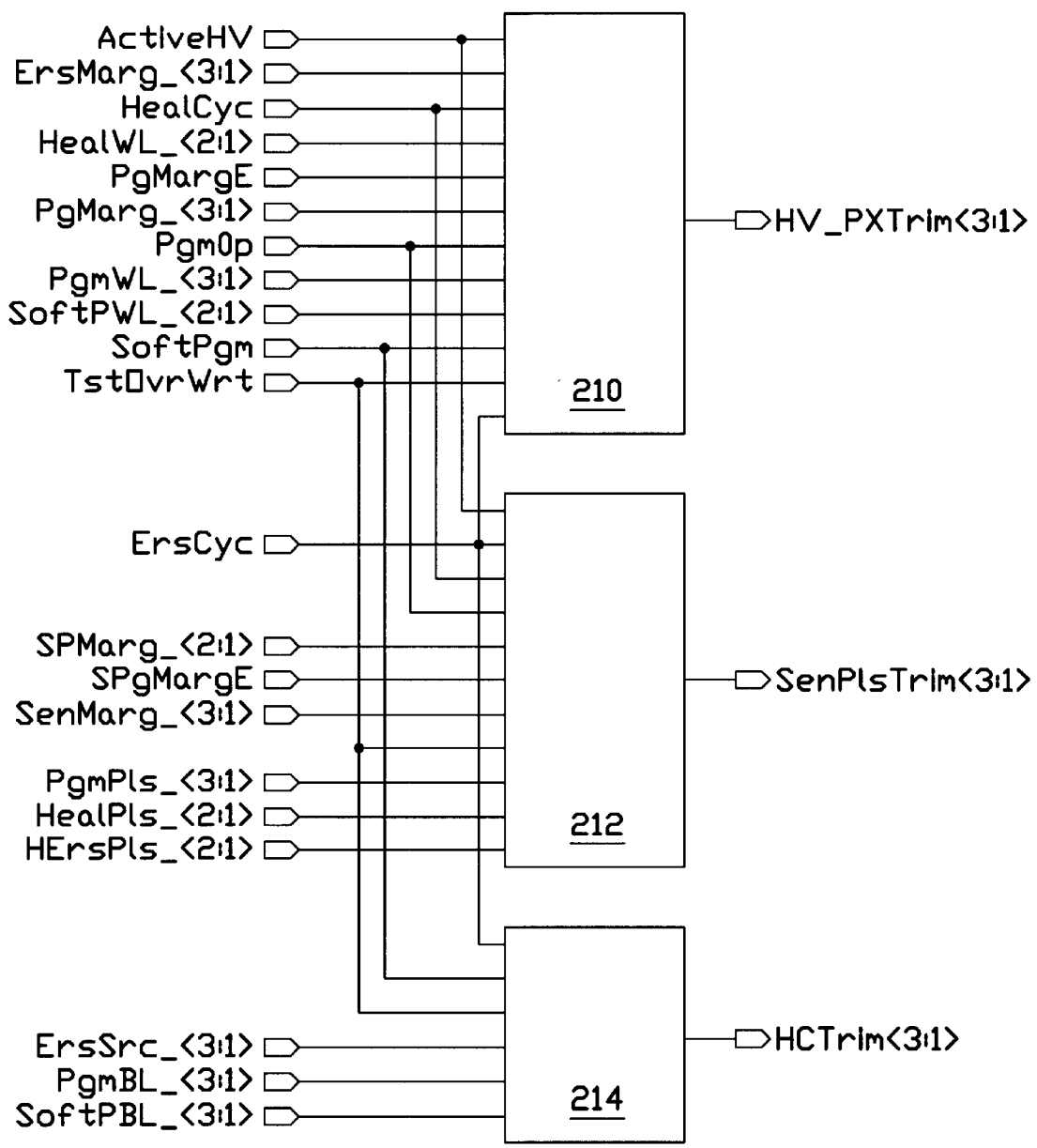
FIG. 4 illustrates one embodiment of a multiplex circuitry.

Referring to FIG. 4, control signals from the trim circuitry are routed using multiplex circuits 210, 212 and 214. The control signals in the integrated circuit memory device 200 are sent over three groups of bus lines with the name or type of the control signal also being identified by the bus name. The first group of buses and respective control signals includes a three bit bus, ErsMarg<3:1>, for transmitting an ErsMarg trim control signal used to adjust the level of the current of the sense amplifier 118 for verifying if a cell 104 is erased properly. A two bit bus, HealWL<2:1>, [is] for transmitting an HealWL trim control signal used to adjust a voltage level of wordlines during a Heal operation after an erase cycle. A three bit bus, PgMarg<3:1>, is used to send a trim signal PgMarg to adjust the level of the current of the sense amplifier 118 for verifying if a cell 104 is programmed properly. A three bit bus, PgmWL<3:1>, is used to send a trim signal PgmWL to adjust the level of the voltage on a wordline during programming operation. Likewise, Soft-PWL<2:1> is a two bit bus used to send a trim signal SoftWL to adjust the level of the voltage on a wordline during soft programming operation. This operation is used to recover from over-erased cells.

This first group of trim fuse outputs are all associated with voltages related to wordlines during high voltage operations and settings which relate to sense amplifier operations. It is important to note that these trim settings are not required at the same time. For example, high voltage operations may be performed first, and then verification operations are performed to determine if an operation was successful using the sense amplifiers. Therefore, these fuse element outputs are placed on the same bus.

A second group of trim circuit outputs include a two bit bus, SPMarg<2:1>, used to send SPMarg trim signals to set soft programming current levels in the sense Amplifiers. A three bit bus, SenMarg<3:1>, includes output trim signal SenMarg of three fuse elements that are used to set the level of verification of the sense amplifier during a normal read operation. A three bit bus, PgmPls<3:1>, provides output trim signal PgmPls of three fuse elements that are used to set the duration of the programming pulse. Likewise, a HealPls<2:1 > bus provides output trim signal HealPls of two fuse elements that are used to set the duration of a heal pulse during a heal operation performs after an erase cycle to recover from over-erasure. Finally, HErPls<2:1> provides output trim signal HErPls of two fuse elements that are used to set the duration of the erase operation after a Heal operation to recover any inadvertently reduced margin of some erased cells. The above described second set of trim element signals are mostly related to sense amplifier outputs.

The third group of trim signals include a three bit bus, ErsSrc<3:1>, used to send a trim signal ErsSrc to set a voltage level on the sources of a memory cells being erased. A three bit bus, PgmBL<3:1>, is [provided] used to transmit a trim signal PgmBL to set a voltage level on bit lines during a programming operation, and a three bit bus, SoftPBL<3:1>, is [provided] used to transmit a trim signal SoftPBL to set a voltage level on the bit lines during a soft programming operation.

The multiplex circuitry 210, 212 and 214 of one embodiment of the present invention routes the 34 control signals from the trim circuitry over nine bus lines. Thus, where prior integrated circuits required 34 metal lines routed around the integrated circuit from the trim location to control different circuits, the present invention uses nine lines.

Figure 5A:
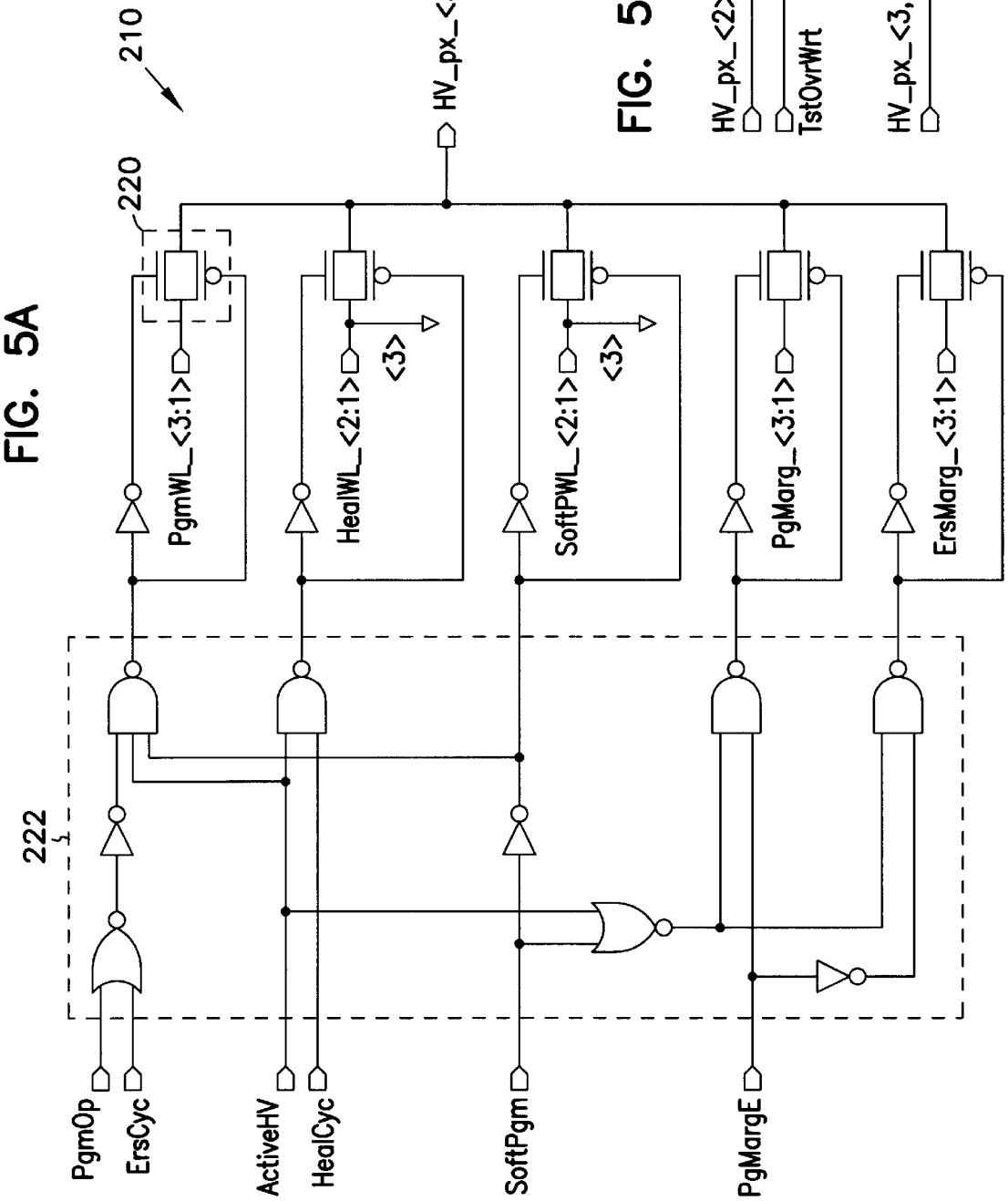
FIGS. 5A and 5B illustrates one embodiment of a high voltage trim multiplex circuit.
Figure 5B:
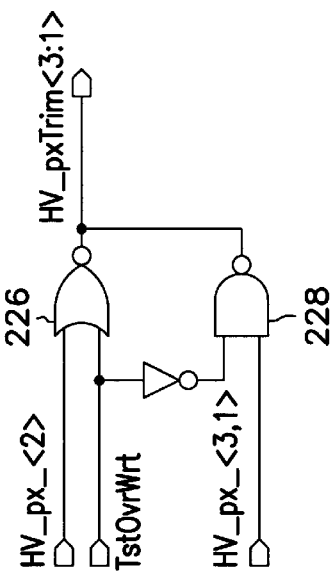

FIGS. 5A and 5B illustrate one embodiment of a high voltage trim multiplex circuit 210 used with the above described first signal group. Seven control signals are used to couple the trim fuses to an internal bus. The signals include an ActiveHV to indicate when the memory is performing High voltage operations within a program or erase operation. A HealCyc signal indicating the performance of a Heal cycle of a memory erase operation. The Program Margin Enable signal, PgMargE, signifies that any reading of the memory array should be performed to verify that the cell has sufficient programming margin. A PgmOp signal is used to indicated that the memory is either in programming mode or pre-programming mode within an erase operation. A SoftPgm signal indicates the execution of a soft programming cycle used in over-erased memory cell threshold recovery. An ErsCyc signal is provided which signifies that the memory is in a cell erase cycle within an erase operation. Finally, a TstOvrWrt signal is used to overwrite the output of all the fuse elements to a known state.

The multiplex circuitry of FIG. 5A couples either the PgmWL<3:1>, HealWL<2:1>, SoftPWL<2:1>, PgMarg<3:1>, or ErsMarg<3:1> trim output signal to the high voltage bus. Each of the trim output signals is coupled to the bus via isolation devices 220, or transistors, controlled by logic circuits 222. The logic expression used to activate the isolation devices for the PgmWL trim signals is:

$$\overline{(PgmOP + ErsCyc) * ActiveHv * Softpgm}$$

The logic expression used to activate the isolation devices for the HealWL trim signals is:

$$\overline{ActiveHV * Healcyc}$$

The logic expression used to activate the isolation devices for the SoftPWL trim signals is/SoftPgm. The logic expression used to activate the isolation devices for the PgMarg trim signals is:

$$\overline{(ActiveHV + Softpgm) * PgmargE}$$

The logic expression used to activate the isolation devices for the ErsMarg trim signals is:

$$\overline{(ActiveHV + Softpgm) * PgmargE}$$

Because the HealWL<2:1>and SoftPWL<2:1>trim signals are two bits, while the bus is three bits, one line of the bus is coupled to ground by the appropriate isolation device. The multiplex also includes a test overwrite circuit 224 which uses the TstOvrWrt signal to couple the bus lines to a trim bus. Two coupling logic circuits are illustrated; one using a NOR gate 226 and one using a NAND gate 228. When the TstOvrWrt signal is in a low state, the bus lines are coupled to the trim bus. When the TstOvrWrt signal is in a high state, the trim bus connections are coupled low.

Figures 6A, 6B:
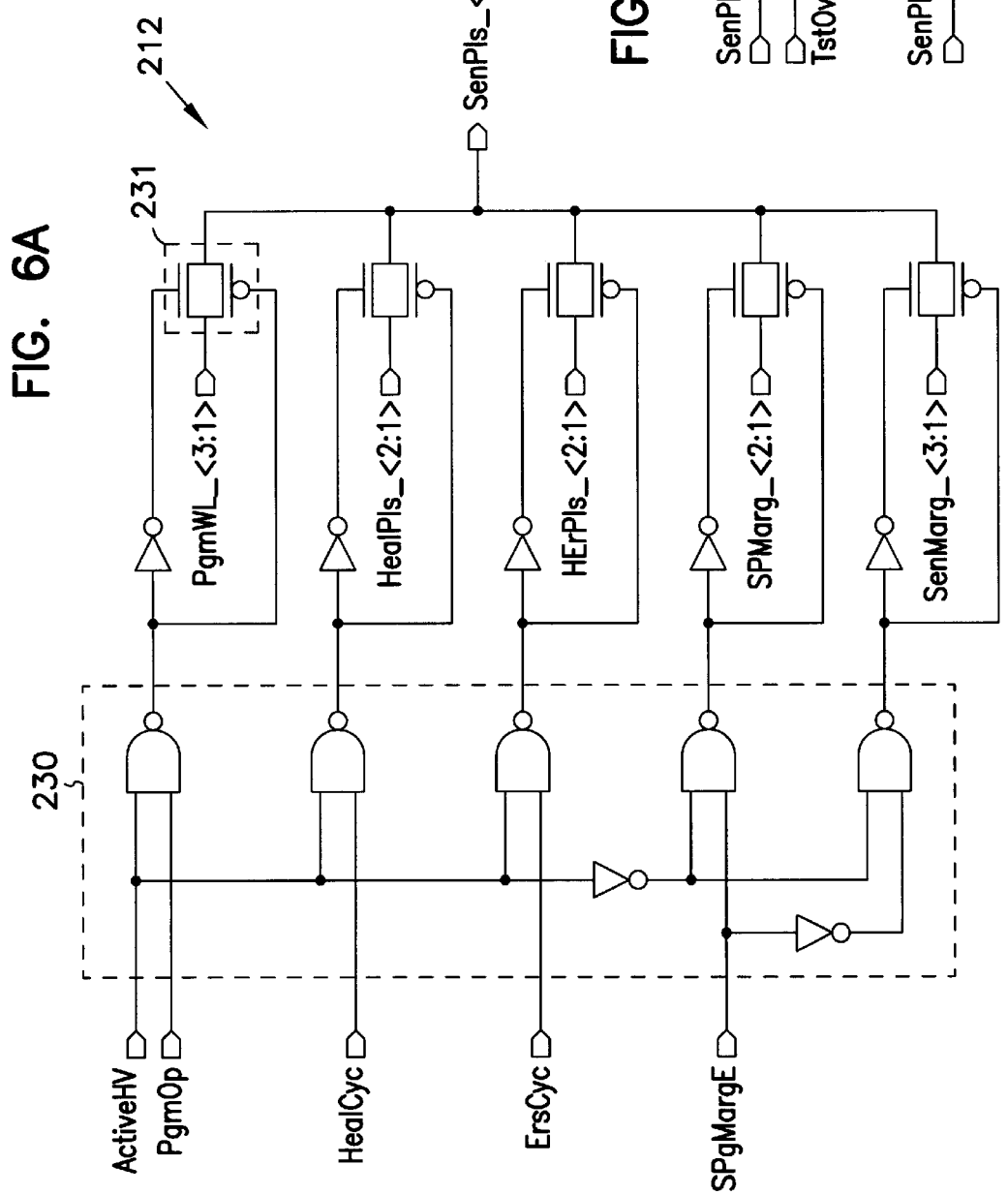
FIGS. 6A and 6B illustrates one embodiment of a sense/pulse trim multiplex circuit.

FIG. 6A and 6B illustrate one embodiment of a sense/pulse trim multiplex circuit 212 used with the above described second signal group. Logic circuit 230 is provided to couple the signal group to bus via isolation devices 231. In addition to some of the above control signals, an additional control signal, SPMargE, is used to indicate that currents read out of memory cells are for soft program margin purposes. When the memory device is in an active high voltage mode, the soft program margin signal trim signals, SPMarg<2:1>, and the sense amplifier verification level, SenMarg<3:1>, are not coupled to the sense/pulse bus. Conversely, during the high voltage operation, the PgmOp, HealCyc, and ErsCyc signals control the coupling of PgmPls<3:1>, HealPls<2:1>, and HerPls<2:1> trim signals to the sense/pulse bus, respectively.

The multiplex of FIG. 6B also includes a test overwrite circuit 232 which uses the TstOvrWrt signal to couple the bus lines to a trim bus. Bus lines one and three are coupled through a NAND gate 234, and bus line 2 is coupled though a NOR gate 236. A latching inverter 240 is provided to latch the third bus line.

Figure 7A:
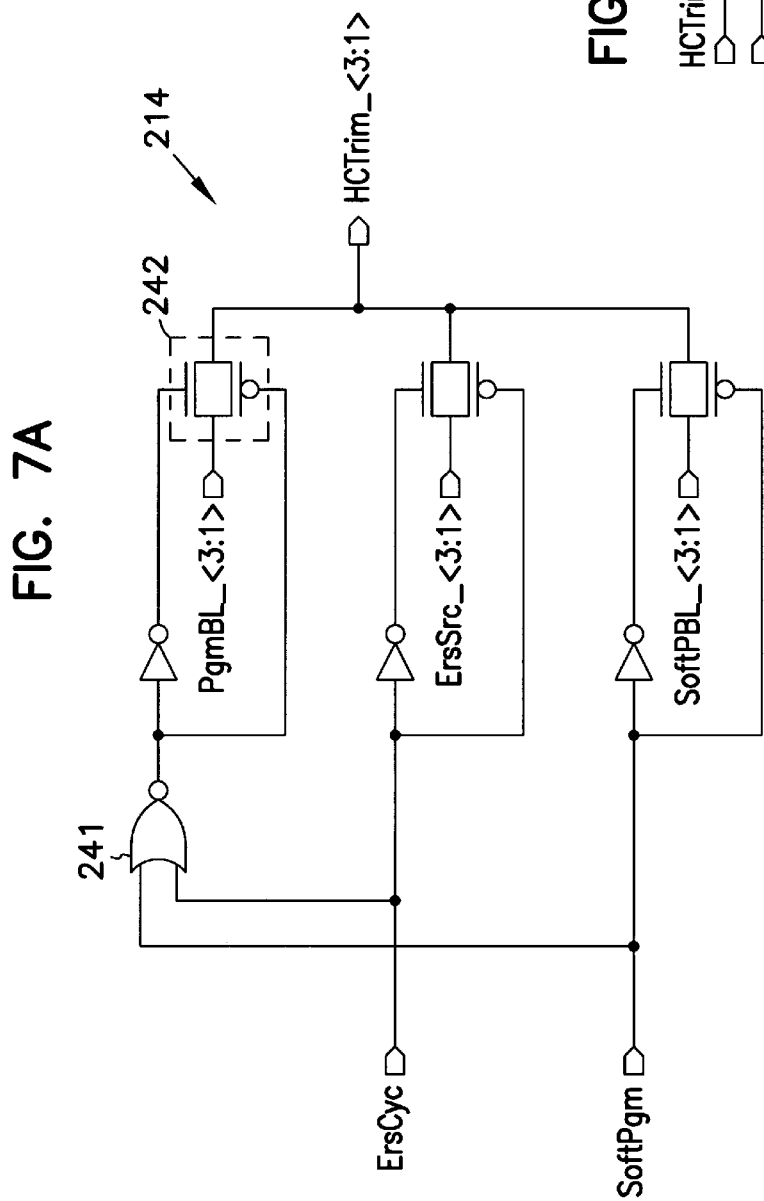
FIGS. 7A and 7B illustrates one embodiment of a high current trim multiplex circuit.
Figure 7B:
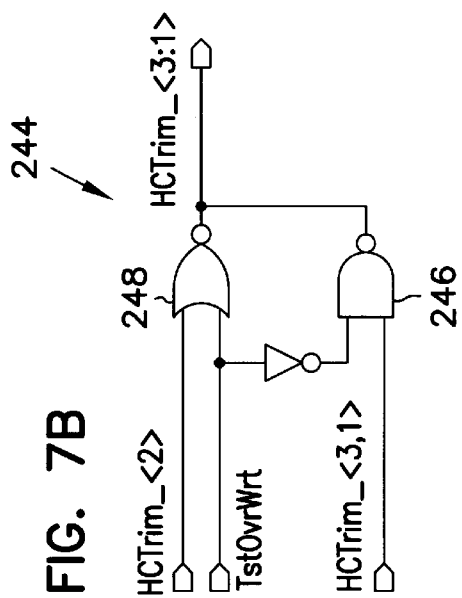

FIG. 7A and 7B illustrates a multiplex circuit 214 used to couple either PgmBL<3:1>, ErsSrc<3:1>, or SoftPBL<3:1> to a three bit high current bus. The multiplex circuitry couples PgmBL<3:1> to the three bit bus in response to a low ErsCyc and a low Softpgm signals via NOR gate 241 and transfer circuitry 242. The ErsSrc<3:1 > signal is coupled to the bus when the ErsCyc signal is high via transfer circuit. Finally, the SoftPBL<3:1> is coupled to the bus when the Softpgm signal is high using transfer circuit. The multiplex of FIG. 7B also includes a test overwrite circuit 244 which uses the TstOvrWrt signal. Bus lines 1 and 3 (HCTrim<3,1>) are coupled through NAND gate 246, and bus line 2 is coupled though NOR gate 248. Thus, when the TstOvrWrt signal is high bus line 2 is coupled low, and bits lines 1 and 3 are coupled high. When the TstOvrWrt signal is low, the bus data is not over written.

CONCLUSION

An integrated circuit has been described which includes trim circuitry to control operations of internal circuitry. Because the trim circuitry includes non-volatile memory it is well suited for use in memory circuits. The integrated circuit includes multiplex circuitry for coupling the trim circuitry to internal circuits via a trim bus in a manner which reduces die area. The trim circuitry is controlled such that fuses used to control different level and timing parameters are grouped together and routed across the integrated circuit using the trim bus and multiplex circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A circuit to control operations of an other circuit, comprising:
   at least one trim circuit to generate a predetermined number of output signals;
   at least one multiplex circuit coupled to the at least one trim circuit; and
   a chosen number of buses coupled between the at least one multiplex circuit and the other circuit, wherein the chosen number of buses is less than the predetermined number of output signals.

2. A circuit to control operations of an other circuit, comprising:

at least one trim circuit to generate a predetermined number of output signals;
a plurality of multiplex circuits coupled to the at least one trim circuit;
a chosen number of buses coupled between the plurality of multiplex circuits and the other circuit, wherein the chosen number of buses is less than the predetermined number of output signals; and
a control circuit coupled to the plurality of multiplex circuits.

3. A circuit to control operations of an other circuit, comprising:
at least one trim circuit to generate a predetermined number of output signals;
a high voltage trim signal multiplex circuit coupled to the at least one trim circuit;
a sense/pulse trim signal multiplex circuit coupled to the at least one trim circuit;
an erase/program signal multiplex circuit coupled to the at least one trim circuit; and
a chosen number of buses coupled between the other circuit and each of the high voltage trim signal multiplex circuit, the sense/pulse trim signal multiplex circuit and the erase/program signal multiplex circuit.

4. A circuit to control operations of an other circuit, comprising:
at least one trim circuit to generate a predetermined number of output signals;
a high voltage trim signal multiplex circuit coupled to the at least one trim circuit;
a sense/pulse trim signal multiplex circuit coupled to the at least one trim circuit;
an erase/program signal multiplex circuit coupled to the at least one trim circuit;
a high voltage bus coupled between the other circuit the high voltage trim signal multiplex circuit and to the other circuit;
a sense/pulse bus coupled between the other circuit and the sense/pulse signal multiplex circuit and to the other circuit; and
a high current bus coupled between the other circuit and the erase/program signal multiplex circuit and to the other circuit.

5. A circuit to control operations of an other circuit, comprising:
at least one trim circuit to generate at least three groups of output signals;
a plurality of multiplex circuits coupled to the at least one trim circuit; and
a chosen number of buses coupled to the plurality of multiplex circuits and the other circuit, wherein the chosen number of buses is less than the at least three groups of output signals.

6. A circuit to control operations of a memory device, comprising:
at least one trim circuit to generate a predetermined number of output signals, including:
a first group of wordline output signals,
a second group of sense amplifier output signals, and
a third group of output signals to control erasure and programming of memory cells of the memory device;
a plurality of multiplex circuits coupled to the at least one trim circuit; and a chosen number of buses coupled between the plurality of multiplex circuits and the memory device, wherein the chosen number of buses is less than the predetermined number of output signals.

7. A circuit to control operations of a memory device, comprising:
at least one trim circuit to generate a predetermined number of output signals, including:
a first group of output signals, the first group of output signals including at least one of:
an erase signal,
a wordline heal signal,
a program margin signal,
a program signal, and
a soft program signal;
a second group of output signals, the second group of output signals including at least one of:
a program margin signal,
a sense amplifier verification level signal,
a program pulse signal,
a heal pulse signal, and
a heal erase pulse signal; and
a third group of output signals, the third group of output signals including at least one of:
a memory source voltage signal,
a line voltage signal used during programming operations, and
a line voltage signal used during soft programming operations; and
a plurality of multiplex circuits coupled to the at least one trim circuit; and
a chosen number of buses coupled between the memory device and the plurality of multiplex circuits, wherein the chosen number of buses is less than the predetermined number of output signals.

8. A circuit to control operations of an other circuit, comprising:
at least one trim circuit to generate a predetermined number of output signals;
a plurality of multiplex circuits coupled to the at least one trim circuit;
a chosen number of buses coupled between the other circuit and the plurality of multiplex circuits, wherein the chosen number of buses is less than the predetermined number of output signals; and
test overwrite circuitry coupled between the plurality of multiplexers and the chosen number of buses.

9. A circuit to control operations of an other circuit, comprising:
at least one trim circuit to generate a predetermined number of output signals;
a plurality of multiplex circuits coupled to the at least one trim circuit;
a chosen number of buses coupled between the other circuit and the plurality of multiplex circuits, wherein the chosen number of buses is less than the predetermined number of output signals; and
at least one logic circuit coupled to the plurality of multiplex circuits to select ones of the predetermined number of output signals to be applied to the chosen number of buses.

10. A circuit to control operations of an other circuit, comprising:
at least one trim circuit to generate a predetermined number of output signals;

a plurality of multiplex circuits coupled to the at least one trim circuit;

a chosen number of buses coupled between the other circuit and the plurality of multiplex circuits, wherein the chosen number of buses is less than the predetermined number of output signals; and at least one logic circuit coupled to the plurality of multiplex circuits, the at least one logic circuit selecting ones of the predetermined number of output signals to be coupled to the chosen number of buses in response to a plurality of control signals.

11. A circuit to control operations of a memory device, comprising:

at least one trim circuit to generate a predetermined number of output signals;

a plurality of multiplex circuits coupled to the at least one trim circuit;

a chosen number of buses coupled between the memory device and the plurality of multiplex circuits, wherein the chosen number of buses is less than the predetermined number of output signals; and a first logic circuit associated with at least one of the plurality of multiplex circuits to select at least one of the predetermined number of output signals in response to at least one of:

a signal for one of a programming mode or a pre-programming mode of the memory device, a signal for an erase cycle of the memory device, a signal for high voltage operations of the memory device, a signal for a heal cycle operation of the memory device, a signal for a soft programming operation of the memory device, and a signal to verify sufficient programming margin of the memory device, and a second logic circuit associated with at least one of the plurality of multiplex circuits to select at least one of the predetermined number of output signals in response to at least one of:

the signal for high voltage operations of the memory device, the signal for one of the programming mode or the pre-programming mode, the signal for the heal cycle operation of the memory device, the signal for the cell erase cycle of the memory device, and a signal to indicate that signals read out of the memory are for soft programming margin purposes.

12. A system, comprising:

a processor; and a memory device coupled to the processor, the memory device including:

at least one trim circuit to generate a predetermined number of output signals, a plurality of multiplex circuits coupled to the at least one trim circuit, and a chosen number of buses coupled between the plurality of multiplex circuits and the memory device, wherein the chosen number of buses is less than the predetermined number of output signals.

13. A system, comprising:

a processor; and a memory device coupled to the processor, the memory device including:

at least one trim circuit to generate a predetermined number of output signals, a high voltage trim signal multiplex circuit coupled to the at least one trim circuit, a sense/pulse trim signal multiplex circuit coupled to the at least one trim circuit, an erase/program signal multiplex circuit coupled to the at least one trim circuit, and a chosen number of buses coupled between the memory device and each of the high voltage trim signal multiplex circuit, the sense/pulse trim signal multiplex circuit and the erase/program signal multiplex circuit.

14. A system, comprising:

a processor; and a memory device coupled to the processor, the memory device including:

at least one trim circuit to generate at least three groups of output signals, a plurality of multiplex circuits coupled to the at least one trim circuit, and a chosen number of buses coupled to the plurality of multiplex circuits and the memory device, wherein the chosen number of buses is less than the predetermined number of output signals.

15. A system, comprising:

a processor; and a memory device coupled to the processor, the memory device including:

at least one trim circuit to generate a predetermined number of output signals, including:

a first group of wordline output signals, a second group of sense amplifier output signals, and a third group of output signals to control erasure and programming of memory cells of the memory device;

a plurality of multiplex circuits coupled to the at least one trim circuit, and a chosen number of buses coupled between the memory device and the plurality of multiplex circuits, wherein the chosen number of buses is less than the predetermined number of output signals.

16. A system, comprising:

a processor; and a memory device coupled to the processor, the memory device including:

at least one trim circuit to generate a predetermined number of output signals, including:

a first group of output signals, the first group of output signals including at least one of:

an erase signal, a wordline heal signal, a program margin signal, a program signal, and a soft program signal;

a second group of output signals, the second group of output signals including at least one of:

a program margin signal, a sense amplifier verification level signal, a program pulse signal, a heal pulse signal, and a heal erase pulse signal; and a third group of output signals, the second group of output signals including at least one of:

a memory source voltage signal, a line voltage signal used during programming operations, and a line voltage signal used during soft programming operations; and a plurality of multiplex circuits coupled to the at least one trim circuit; and a chosen number of buses coupled between the memory device and the plurality of multiplex circuits, wherein the chosen number of buses is less than the predetermined number of output signals.

17. A system, comprising:

a processor; and a memory device coupled to the processor, the memory device including:
   at least one trim circuit to generate a predetermined number of output signals,
   a plurality of multiplex circuits coupled to the at least one trim circuit,
   a chosen number of buses coupled between the memory device and the plurality of multiplex circuits, wherein the chosen number of buses is less than the predetermined number of output signals, and
   at least one logic circuit coupled to the plurality of multiplex circuits, the at least one logic circuit being coupled to a plurality of control signals to select ones of the predetermined number of output signals to be coupled to the chosen number of buses.

18. A method of controlling a circuit, comprising:

generating a predetermined number of trim signals; and selecting a group of signals from the predetermined number of trim signals to be coupled to a chosen number of buses, wherein the predetermined number of trim signals is more than the chosen number of buses and wherein each selected signal of the group of signals is coupled to a respective one of the chosen number of buses.

19. A method of controlling a circuit, comprising:

generating a predetermined number of trim signals;

generating a plurality of control signals; and selecting trim signals from the predetermined number of trim signals in response to the plurality of control signals to be coupled to a chosen number of buses coupled to the circuit, wherein the chosen number of buses is less than the predetermined number of trim signals.

20. A method of controlling a circuit, comprising:

generating a predetermined number of trim signals;

generating a plurality of control signals; and multiplexing the predetermined number of trim signals by selecting trim signals from the predetermined number of trim signals in response to the plurality of control signals to be coupled to a chosen number of buses coupled to the circuit, wherein the chosen number of buses is less than the predetermined number of trim signals.

21. A method of controlling a memory device, comprising:

generating at least one high voltage trim signal;

generating at least one sense/pulse trim signal;

generating at least one erase/program signal;

coupling the at least one high voltage trim signal to a high voltage bus coupled to the memory device;

coupling the at least one sense/pulse trim signal to a sense/pulse bus coupled to the memory device; and coupling the at least one erase/program signal to a high current bus coupled to the memory device.

22. A method of controlling a memory device, comprising:

generating a plurality of high voltage trim signals;

generating a plurality of sense/pulse trim signals;

generating a plurality of erase/program signals;

selecting signals from the plurality of high voltage trim signals to be coupled to a high voltage bus;

selecting signals from the plurality of sense/pulse trim signals to be coupled to a sense/pulse bus; and selecting signals from the plurality of erase/program signals to be coupled to a high current bus.

23. A method of controlling a memory device, comprising:

generating a first group of output signals;

generating a second group of output signals;

generating a third group of output signals;

coupling selected ones of the first group of output signals to a first predetermined number of buses, wherein the first predetermined number of buses is less than the first group of output signals;

coupling selected ones of the second group of output signals to a second predetermined number of buses, wherein the second predetermined number of buses is less than the second group of output signals; and coupling selected ones of the third group of output signals to a third predetermined number of buses, wherein the third predetermined number of buses is less than the third group of output signals.

24. A method of controlling a memory device, comprising:

generating a first group of output signals, wherein generating the first group of output signals includes generating at least one of:
   a wordline heal signal,
   a program margin signal,
   a program signal, and
   a soft program signal;

generating a second group of output signals, wherein generating the second group of output signals includes generating at least one of:
   a program margin signal,
   a sense amplifier verification level signal,
   a program pulse signal,
   a heal pulse signal, and
   a heal erase pulse signal; and generating a third group of output signals, wherein generating the third group of output signals includes generating at least one of:
   a memory source voltage signal,
   a line voltage signal used during programming operations,
   a line voltage signal used during soft programming operations, and coupling selected ones of the first, second and third groups of output signals to respective buses.

25. A method of controlling a memory device, comprising:

generating a first group of output signals, wherein generating the first group of output signals includes generating at least one of:
   a wordline heal signal,
   a program margin signal,
   a program signal, and
   a soft program signal;

generating a second group of output signals, wherein generating the second group of output signals includes generating at least one of:
a program margin signal,
a sense amplifier verification level signal,
a program pulse signal,
a heal pulse signal, and
a heal erase pulse signal; and
generating a third group of output signals, wherein generating the third group of output signals includes generating at least one of:
a memory source voltage signal,
a line voltage signal used during programming operations, and
a line voltage signal used during soft programming operations; and
coupling selected ones of the first group of output signals to at least one associated bus;
coupling selected ones of the second group of output signals to at least one associated bus; and
coupling selected ones of the third group of output signals to at least one high associated bus.

26. A method of controlling a memory device, comprising:
generating a signal for one of a programming mode or a pre-programming mode of the memory device;
generating a signal for an erase cycle of the memory device;
generating a signal for the memory device to perform high voltage operations;
generating a signal for the memory to perform a heal cycle operation;
generating a signal for the memory to perform a soft programming operation; and
generating a signal to verify sufficient programming margin of the memory device.

27. A method of controlling a memory device, comprising:
generating a first group of output signals, wherein generating the first group of output signals includes generating at least one of:
a wordline heal signal,
a program margin signal,
a program signal, and
a soft program signal;
generating a second group of output signals, wherein generating the second group of output signals includes generating at least one of:
a program margin signal,
a sense amplifier verification level signal,
a program pulse signal,
a heal pulse signal, and
a heal erase pulse signal; and
generating a third group of output signals, wherein generating the third group of output signals includes generating at least one of:
a memory source voltage signal,
a line voltage signal used during programming operations,
a line voltage signal used during soft programming operations, and
selecting ones of the first group of output signals to be coupled to at least one associated bus in response to at least one control signal;
selecting ones of the second group of output signals to be coupled to at least one associated bus in response to the at least one control signal or at least one other control signal; and selecting ones of the third group of output signals to be coupled to at least one associated bus in response to the at least one control signal or at least one other control signals.

28. A method of controlling a memory device, comprising:
generating a first control signal for a programming mode or a pre-programming mode of the memory device;
generating a second control signal for an erase cycle of the memory device;
generating a third control signal for the memory device to perform high voltage operations;
generating a fourth control signal for the memory device to perform a heal cycle operation;
generating a fifth control signal for the memory device to perform a soft programming operation; and
generating a sixth control signal to verify sufficient programming margin of the memory device;
coupling at least one of:
a wordline heal signal,
a program margin signal,
a program signal, and
a soft program signal to an associated bus in response to at least one of the control signals;
coupling at least one of:
a program margin signal,
a sense amplifier verification level signal,
a program pulse signal,
a heal pulse signal, and
a heal erase pulse signal to an associated bus in response to at least one of the control signals; and
coupling at least one of:
a memory source voltage signal,
a line voltage signal used during programming operations, and
a line voltage signal used during soft programming operations to an associate bus in response to at least one of the control signals.

29. A method of making an integrated circuit, comprising:
forming at least one trim circuit;
forming at least one multiplex circuit;
interconnecting the at least one trim circuit and the at least one multiplex circuit by a predetermined number of signal buses;
forming at least one internal circuit;
interconnecting the at least one internal circuit to the at least one multiplex circuit by a selected number of buses, wherein the selected number of buses is less than the predetermined number of signal buses to reduce die size.

30. A method of making an integrated circuit, comprising:
coupling at least one trim circuit to at least one multiplex circuit; and
coupling the at least one multiplex circuit to an internals circuit by a selected number of buses, wherein the selected number of buses is less than a plurality of signals generated by the at least one trim circuit.

31. A method of making an integrated circuit, comprising:
coupling a trim circuit to at least one multiplex circuit;
coupling the at least one multiplex circuit to an internal circuit by a selected number of buses, wherein the selected number of buses is less than a plurality of signals generable by the at least one trim circuit; and
coupling a control circuit to the at least one multiplex circuit.

32. A method of making an integrated circuit, comprising:

coupling a trim circuit to a first multiplex circuit, a second multiplex circuit and a third multiplex circuit;

coupling the first multiplex circuit to an internal circuit by a first selected number of buses, wherein the first selected number of buses is less than a first group of trim signals generable by the trim circuit;

coupling the second multiplex circuit to the internal circuit by a second selected number of buses, wherein the second selected number of buses is less than a second group of trim signals generable by the trim circuit; and coupling the third multiplex circuit to the internal circuit by a third selected number of buses, wherein the third selected number of buses is less than a third group of trim signals generable by the trim circuit.

* * * * *

UNITED STATES PATENT AND TRADEMARK OFFICE
CERTIFICATE OF CORRECTION

PATENT NO. : 6,457,093 B2  Page 1 of 1
DATED : September 24, 2002
INVENTOR(S) : Frankie Fariborz Roohparvar It is certified that error appears in the above-identified patent and that said Letters Patent is hereby corrected as shown below:

<u>Column 4,</u>
Line 15, delete "[is]".
Line 59, delete "[provided]".
Line 62, delete "[provided]".

Signed and Sealed this

Fourth Day of February, 2003

JAMES E. ROGAN
*Director of the United States Patent and Trademark Office*